(12) United States Patent
Guan

(10) Patent No.: US 8,081,457 B2
(45) Date of Patent: Dec. 20, 2011

(54) COOLING SYSTEM AND ELECTRONIC DEVICE USING THE SAME

(75) Inventor: Zhi-Bin Guan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 22 days.

(21) Appl. No.: 12/611,878

(22) Filed: Nov. 3, 2009

(65) Prior Publication Data

US 2011/0043997 A1    Feb. 24, 2011

(30) Foreign Application Priority Data

Aug. 21, 2009    (CN) .......................... 2009 1 0305887

(51) Int. Cl.
*H05K 7/20*    (2006.01)

(52) U.S. Cl. .............. 361/695; 361/679.48; 361/679.49; 361/679.5; 361/679.51; 361/692; 454/184; 165/104.33; 312/223.2

(58) Field of Classification Search ............ 361/678.48–679.51, 688, 689, 690, 692, 694, 695, 697
See application file for complete search history.

(56) References Cited

U.S. PATENT DOCUMENTS

| | | | | |
|---|---|---|---|---|
| 6,163,454 A | * | 12/2000 | Strickler | 361/695 |
| 6,554,697 B1 | * | 4/2003 | Koplin | 454/184 |
| 6,667,883 B1 | * | 12/2003 | Solis et al. | 361/695 |
| 6,914,779 B2 | * | 7/2005 | Askeland et al. | 361/679.51 |
| 6,958,906 B2 | * | 10/2005 | Wu et al. | 361/679.5 |
| 2004/0201957 A1 | * | 10/2004 | Wu et al. | 361/687 |
| 2005/0276017 A1 | * | 12/2005 | Aziz et al. | 361/695 |

* cited by examiner

*Primary Examiner* — Courtney Smith
(74) *Attorney, Agent, or Firm* — Altis Law Group, Inc.

(57) ABSTRACT

A cooling system includes a system air intake, a system air outlet, a fan, and a noise-reducing outlet. The fan includes a fan intake, and a fan outlet. The fan drives airflow, from the system air intake through the fan intake, the fan outlet, and the system air outlet. The noise-reducing outlet is located adjacent to the fan outlet. When the airflow exits through the fan outlet, a portion of the airflow exits through the noise-reducing outlet.

5 Claims, 4 Drawing Sheets

COOLING SYSTEM AND ELECTRONIC DEVICE USING THE SAME

BACKGROUND

1. Technical Field

The present disclosure relates to a cooling system and an electronic device using the cooling system.

2. Description of Related Art

In order to reduce noise, rigid specifications for sound quality have been enacted in industry. In those specifications, loudness, tonality, and modulation strength are all important measurable parameters.

In an electronic device, such as a computer, a fan is commonly employed for dissipating heat. The fan drives the airflow to dissipate heat, however, aerodynamic noise is correspondingly generated, creating health hazards and impairing communications. Modulation strength is a major parameter of aerodynamic noise.

DETAILED DESCRIPTION

Figure 1:
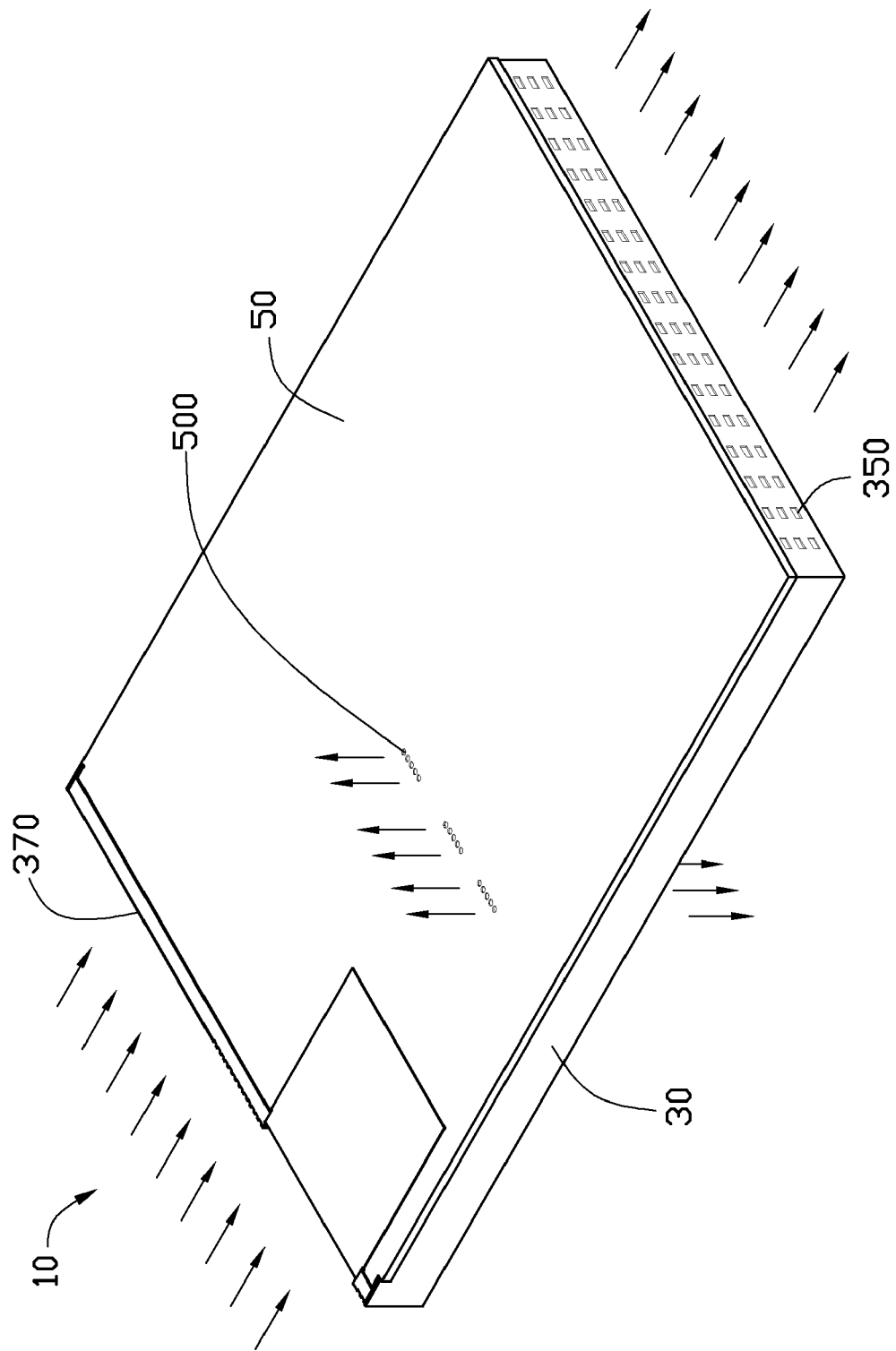
FIG. 1 is an isometric view of a first embodiment of an electronic device.
Figure 2:
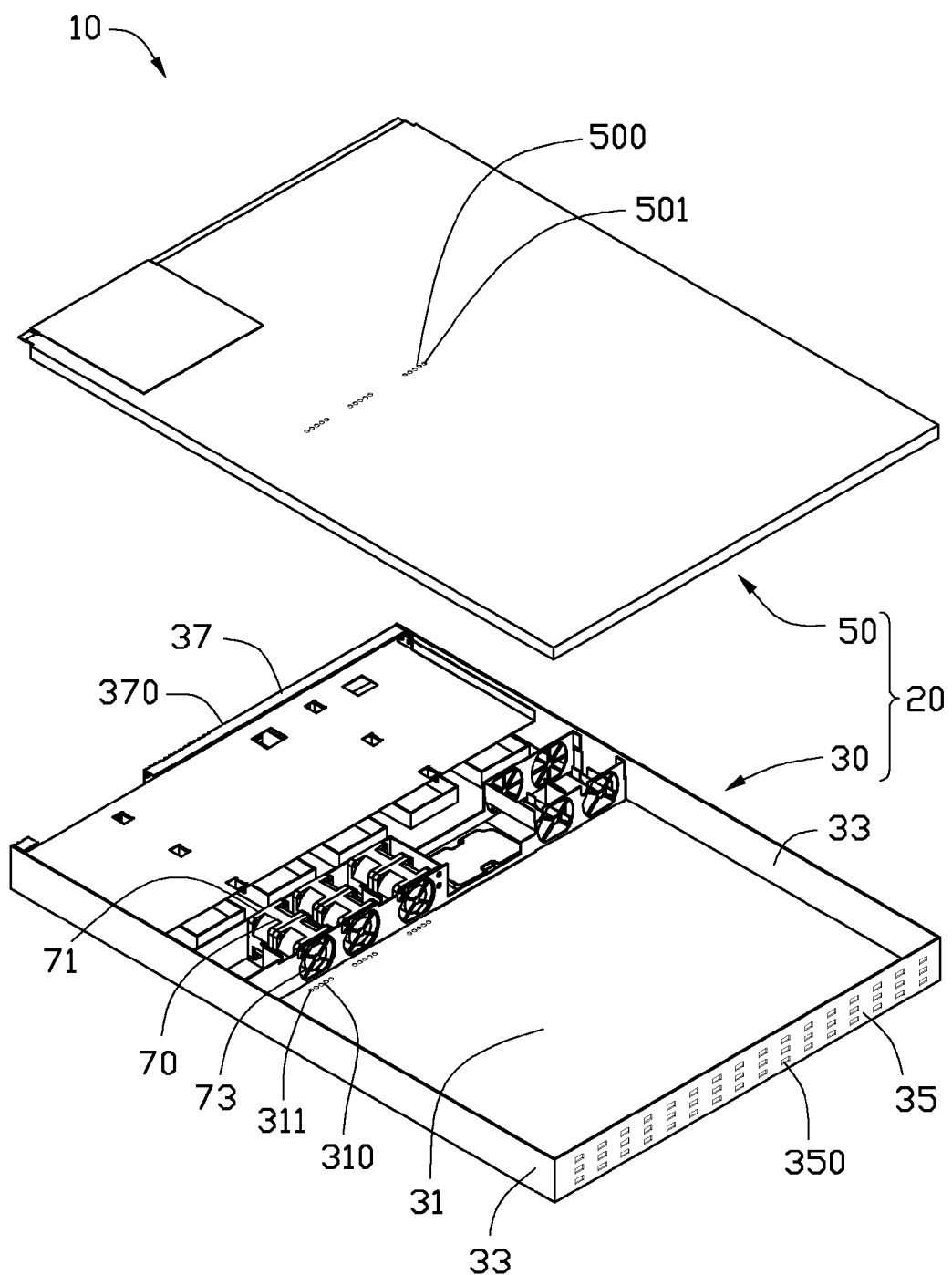
FIG. 2 is an exploded, isometric view of the electronic device in FIG. 1

Referring to FIGS. 1 and 2, a first embodiment of an electronic device 10 includes a shell 20, and three fans 70 mounted in the shell 20.

The shell 20 includes a base 30, and a top board 50 removably mounted thereon. The base 30 includes a bottom board 31, two sideboards 33 extending perpendicular upward from opposite sides of the bottom board 31, and a front board 35 and a rear board 37 extending perpendicular upward from opposite ends of the bottom board 31 and between the sideboards 33. A plurality of holes (not shown) is defined in the rear board 37, to form a system air intake 370. A plurality of holes is defined in the front board 35, to form a system air outlet 350. Three first noise-reducing outlets 310 are defined in the bottom board 31. Each first noise-reducing outlet 310 includes five round first holes 311 defined in the bottom board 31. The first holes 311 are arranged in a line parallel to the front board 35 and the rear board 37. The top board 50 is opposite to the bottom board 31. The top board 50 defines three second noise-reducing outlets 500. Each second noise-reducing outlet 500 includes five round second holes 501 defined in the top board 50. The second holes 501 are arranged in a line, parallel to the front board 35 and the rear board 37. When the top board 50 is mounted on the base 30, the second noise-reducing outlets 500 are aligned with the first noise-reducing outlets 310, respectively.

The fans 70 are mounted abreast in the base 30. Each fan 70 includes a fan intake 71, and a fan outlet 73 opposite to the fan intake 71. The fans 70 are mounted between the first noise-reducing outlets 310 and the system air intake 370. The fan intakes 71 face the system air intake 370. The fan outlets 73 face the system air outlet 350. The fan outlets 73 are close and adjacent to the first noise-reducing outlets 310, respectively.

In use, the fans 70 drive airflow into the electronic device 10 through the system air intake 370 parallel to the bottom board 31, and in turn through the fan intakes 71, the fan outlets 73, and the system air outlet 350 to the exterior of the electronic device 10. When the airflow enters the electronic device 10, a portion thereof exits through the first noise-reducing outlets 310 and the second noise-reducing outlets 500 to the exterior of the electronic device 10 perpendicular to the bottom board 31.

The fan generates a pressure gradient in the electronic device 10, degrading from the system air intake 370 to the system air outlet 350. Furthermore, the change of the pressure gradient is greatest at the fan outlets 73, which is a main contributor to aerodynamic noise. Thus, the first noise-reducing outlets 310 and the second noise-reducing outlets 500 exhaust a portion of the airflow at the fan outlets 73 to the exterior of the electronic device 10, reducing the change of pressure gradient at the fan outlets 73, and, correspondingly, aerodynamic noise.

It is noted that in other embodiments, the number of fans 70 may be adjusted according to actual need. Furthermore, the number, the shape and/or arrangement of the first holes 311 and the second holes 501 of the first noise-reducing outlets 310 and the second noise-reducing outlets 500 may be similarly adjusted while remaining well within the scope of the disclosure.

Figure 3:
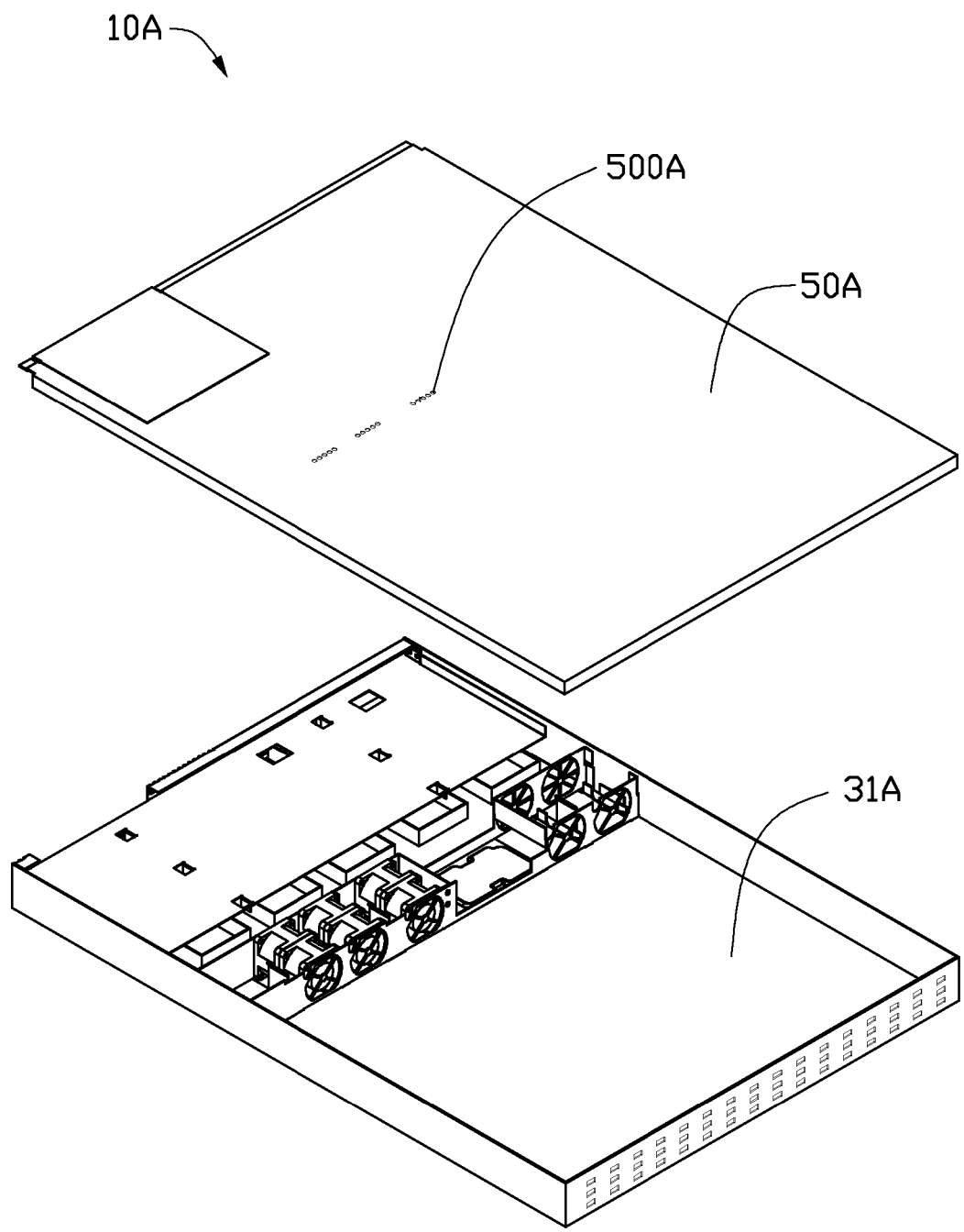
FIG. 3 is an exploded, isometric view of a second embodiment of an electronic device.

Referring to FIG. 3, a second embodiment of an electronic device 10A is shown, differing from the first embodiment in FIG. 1 only in the absence of noise-reducing outlets in the bottom board 31A, with only the top board 50A defining noise-reducing outlets 500A. It can be seen that in other embodiments, the noise-reducing outlets 500A may be replaced to the bottom board 31A and omitted from other areas.

Figure 4:
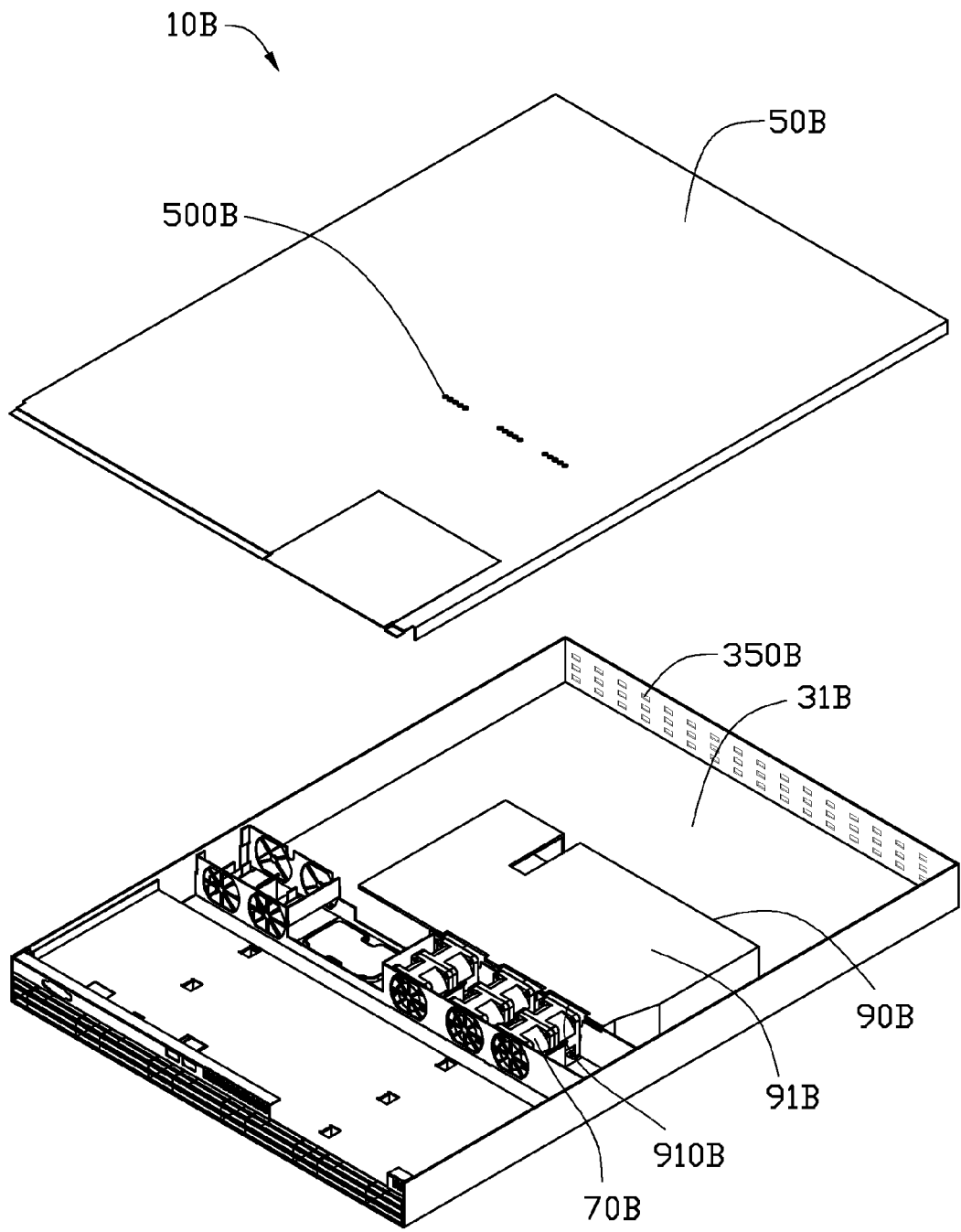
FIG. 4 is an exploded, isometric view of a third embodiment of an electronic device.

Referring to FIG. 4, a third embodiment of an electronic device 10B is shown, differing from the second embodiment in FIG. 3 only in that a guide duct 90B is added for guiding the air to help dissipating heat. The guide duct 90B is mounted to the bottom board 31B between the fan outlets of the fans 70B and the system air outlet 350B. An intake of the guide duct 90B is directly connected with the fan outlets of the fans 70B. The guide duct 90B guides airflow towards the system air outlet 350B. A plurality of elongated holes 910B is defined in a top wall 91B of the guide duct 90B, adjacent to the fans 70B and aligned with the noise-reducing outlets 500B in the top board 50B of the electronic device 10B. A portion of the airflow passes through the holes 910B to go through the noise-reducing outlets 500B to the exterior of the electronic device 10B.

It has been proven in tests that the presence of the noise-reducing outlets 310, 500, 500A, 500B can reduce modulation strength (unit: %) for an average of about 9%, which greatly advances sound quality of the electronic device 10, 10A or 10B.

Furthermore, the usage of the noise-reducing outlets 310, 500, 500A, 500B can reduce about 2.2 decibels of loudness and about 0.03 tonality unit, which further advances the sound quality.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:
a base comprising a bottom board, a front board extending from a front end of the bottom board, and a rear board extending from a rear end of the bottom board and opposite to the front board, wherein a system air intake is defined in the rear board, and a system air outlet is defined in the front board;
a fan mounted in the base and comprising a fan intake facing the system air intake, and a fan outlet facing the system air outlet; and
a top board mounted on the base and opposite to the bottom board;
wherein a first noise-reducing outlet is defined in the top board, adjacent to the fan outlet;
wherein a guide duct is mounted in the base, the guide duct is located between the fan outlet and the system air outlet, the guide duct comprises an intake directly connected with the fan outlet, and a top wall, a hole is defined in the top wall, adjacent to the fan and communicating with the intake of the guide duct.

2. The electronic device of claim 1, wherein the first noise-reducing outlet comprises a plurality of holes defined in the top board arranged in a line parallel to the front board and the rear board.

3. The electronic device of claim 2, wherein the fan is located between the system fan intake and the first noise-reducing outlet.

4. The electronic device of claim 3, wherein a second noise-reducing outlet is defined in the bottom board, aligning with the first noise-reducing outlet.

5. An electronic device comprising:
a base comprising a bottom board, a front board extending from a front end of the bottom board, and a rear board extending from a rear end of the bottom board and opposite to the front board, wherein a system air intake is defined in the rear board, and a system air outlet is defined in the front board;
a fan mounted in the base and comprising a fan intake facing the system air intake, and a fan outlet facing the system air outlet; and
a top board mounted on the base and opposite to the bottom board;
wherein a first noise-reducing outlet is defined in the top board, adjacent to the fan outlet, the first noise-reducing outlet comprises a plurality of holes defined in the top board arranged in a line parallel to the front board and the rear board, the fan is located between the system fan intake and the first noise-reducing outlet.

* * * * *